US011927819B2

United States Patent
Srinivasan et al.

(10) Patent No.: US 11,927,819 B2
(45) Date of Patent: Mar. 12, 2024

(54) OPTICAL DEVICE HAVING A LIGHT-EMITTING STRUCTURE AND A WAVEGUIDE INTEGRATED CAPACITOR TO MONITOR LIGHT

(71) Applicant: Hewlett Packard Enterprise Development LP, Houston, TX (US)

(72) Inventors: Sudharsanan Srinivasan, Santa Barbara, CA (US); Di Liang, Santa Barbara, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/454,410

(22) Filed: Nov. 10, 2021

(65) Prior Publication Data

US 2023/0143150 A1    May 11, 2023

(51) Int. Cl.
 *G02B 6/12* (2006.01)
 *G02B 6/42* (2006.01)
 (Continued)

(52) U.S. Cl.
 CPC ....... *G02B 6/4295* (2013.01); *G02B 6/12004* (2013.01); *G02B 6/4274* (2013.01);
 (Continued)

(58) Field of Classification Search
 CPC ............. G02B 6/12004; G02B 6/4274; G02B 6/4283; G02B 6/4286; G02B 6/4295;
 (Continued)

(56) References Cited

U.S. PATENT DOCUMENTS 6,175,672 B1    1/2001  Newberg et al.
6,985,648 B2    1/2006  Kish, Jr. et al.
(Continued)

FOREIGN PATENT DOCUMENTS

WO    WO-2004034530    4/2004

OTHER PUBLICATIONS

Stabile, R. et al.; "Optical power meter co-integrated with a fast optical switch for on-chip OSNR monitoring", Sep, 22-25, 2015; 3 pages.
(Continued)

*Primary Examiner* — Ryan A Lepisto
(74) *Attorney, Agent, or Firm* — Hewlett Packard Enterprise Patent Department (57) ABSTRACT

Examples described herein relate to an optical device with an integrated light-emitting structure to generate light and a waveguide integrated capacitor to monitor light. The light-emitting structure may emit light upon the application of electricity to the optical device. The waveguide integrated capacitor may be formed under the light-emitting structure to monitor the light emitted by the light-emitting structure. The waveguide integrated capacitor includes a waveguide region carrying at least a portion of the light. The waveguide region includes one or more photon absorption sites causing the generation of free charge carriers relative to an intensity of the light confined in the waveguide region resulting in a change in the conductance of the waveguide region.

22 Claims, 6 Drawing Sheets

(51) Int. Cl.
 *H01S 5/026* (2006.01)
 *H01S 5/20* (2006.01)
(52) U.S. Cl.
 CPC ......... *G02B 6/4283* (2013.01); *G02B 6/4286* (2013.01); *H01S 5/026* (2013.01); *H01S 5/0264* (2013.01); *H01S 5/2018* (2013.01); *G02B 2006/12085* (2013.01); *G02B 2006/12097* (2013.01); *G02B 2006/12121* (2013.01); *G02B 2006/12123* (2013.01); *G02B 2006/12128* (2013.01); *G02B 2006/12138* (2013.01)

(58) Field of Classification Search
 CPC .......... G02B 2006/12085; G02B 2006/12097; G02B 2006/12121; G02B 2006/12123; G02B 2006/12128; G02B 2006/12138; H01S 5/026; H01S 5/0264; H01S 5/2018
 See application file for complete search history.

(56) References Cited

U.S. PATENT DOCUMENTS

| | | | |
|---|---|---|---|
| 6,987,910 B2 * | 1/2006 | Shappir | G02F 1/025 |
| | | | 385/37 |
| 7,043,097 B2 | 5/2006 | Coldren et al. | |
| 7,164,699 B1 | 1/2007 | Braun et al. | |
| 7,289,197 B2 | 10/2007 | Kewitsch | |
| 7,495,203 B2 | 2/2009 | Kaku et al. | |
| 7,519,246 B2 | 4/2009 | Welch et al. | |
| 7,751,658 B2 | 7/2010 | Welch et al. | |
| 8,269,303 B2 * | 9/2012 | Fujikata | G02B 6/12004 |
| | | | 257/466 |
| 8,937,981 B2 * | 1/2015 | Liang | H01S 5/06213 |
| | | | 372/29.013 |
| 9,490,385 B2 * | 11/2016 | Huang | H01L 31/028 |
| 9,507,180 B2 * | 11/2016 | Xu | H01L 29/94 |
| 9,612,503 B2 * | 4/2017 | Liang | G02F 1/2257 |
| 9,722,124 B2 | 8/2017 | Melloni et al. | |
| 9,749,043 B2 | 8/2017 | Perron | |
| 9,791,347 B2 | 10/2017 | Guimond | |
| 10,078,233 B2 * | 9/2018 | Liang | G02F 1/3133 |
| 10,109,983 B2 * | 10/2018 | Liang | H01S 5/0218 |
| 10,381,801 B1 * | 8/2019 | Liang | H01S 5/22 |
| 10,897,119 B1 * | 1/2021 | Kurczveil | H01S 5/0261 |
| 11,251,326 B2 * | 2/2022 | Szelag | H01L 31/1075 |
| 11,442,235 B1 * | 9/2022 | Liang | G01J 1/0407 |
| 11,536,899 B2 * | 12/2022 | Parker | G02B 6/1225 |
| 2006/0268395 A1 | 11/2006 | Steckl et al. | |
| 2008/0044128 A1 | 2/2008 | Kish, Jr. et al. | |
| 2012/0087659 A1 | 4/2012 | Gill | |
| 2014/0177994 A1 * | 6/2014 | Chen | H01L 31/105 |
| | | | 438/69 |
| 2016/0164601 A1 | 6/2016 | Perron | |
| 2016/0315451 A1 | 10/2016 | de Valicourt et al. | |
| 2016/0359074 A1 | 12/2016 | Melloni et al. | |
| 2020/0003978 A1 | 1/2020 | Kewitsch | |
| 2021/0006044 A1 | 1/2021 | Hong et al. | |
| 2021/0173238 A1 | 6/2021 | Hosseinzadeh et al. | |
| 2022/0005961 A1 * | 1/2022 | Qi | H01L 31/028 |
| 2022/0091446 A1 * | 3/2022 | Cheung | G02F 1/025 |
| 2022/0107461 A1 * | 4/2022 | Dosunmu | G02B 6/12004 |
| 2022/0416097 A1 * | 12/2022 | Kohen | G02B 6/12 |
| 2023/0014190 A1 * | 1/2023 | Yuan | H01L 31/035281 |

OTHER PUBLICATIONS

Zhu, H. et al.: "On-Chip Optical Power Monitor Using Periodically Interleaved P-N Junctions Integrated on a Silicon Waveguide"; Jan. 22, 2014; 8 pages.

* cited by examiner

OPTICAL DEVICE HAVING A LIGHT-EMITTING STRUCTURE AND A WAVEGUIDE INTEGRATED CAPACITOR TO MONITOR LIGHT

STATEMENT OF GOVERNMENT RIGHTS

This invention was made with Government support under Award No. DE-AR0001039 awarded by DOE, Office of ARPA-E. The Government has certain rights in this invention.

BACKGROUND

Optical systems include optical devices that can generate, process, and/or carry optical signals from one point to another point. In certain implementations, optical systems such as optical communication systems may facilitate data communication over longer distances with higher bandwidth using smaller cable width (or diameter) in comparison to communication systems using electrical wires. In an optical communication system, a light may be generated by a light source such as a laser. In some optical systems, external light monitoring devices such as photodiodes are used to monitor the light generated by the light source.

BRIEF DESCRIPTION OF THE DRAWINGS

Various examples will be described below with references to the following figures.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, the same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

Optical systems may include various optical devices (e.g., components) such as, but not limited to, light sources (e.g., lasers), optical modulators, optical filters, optical amplifiers, optical couplers, waveguides, optical combiners, optical multiplexers, optical demultiplexers, optical resonators, or photodetectors (e.g., photodiodes). Some optical systems may include light monitoring circuits that monitor optical signals contained within one or more such optical components. Such monitoring of the light may be useful in correcting certain operational parameters, for example, biasing conditions in the presence of changing environmental conditions or aging of the optical devices.

A common technique used in some light monitoring circuits entails extracting a small portion of the light from an optical component using one or more optical splitters. The extracted light may be routed to one or more separate photodetectors (e.g., photodiodes) that convert the extracted light into an electrical signal (e.g., electrical current). Such extraction of the light and routing of the extracted light to the separate photodetectors may result in loss of useful optical power. Further, the photodetectors used to convert the light into electrical signals may not have been properly calibrated, resulting in an inaccurate measurement of the light. Moreover, in an optical system having several optical components (e.g., light source, ring resonators, etc. cascaded in a long chain), the use of the abovementioned light monitoring technique may result in increased optical losses. Additionally, the above-described light monitoring technique may suffer from uncertainties in the splitting ratio among the various splitters used, even if the designs of the splitters are similar. Furthermore, the light from the splitters may be routed across a chip to the photodetector which may lead to further uncertainties in the power level or unavoidable waveguide crossings. In some implementations, the use of additional structural elements such as the separate photodetectors may require additional space leading to an increase in the overall footprint of the optical system and/or require compromise on internal structure and/or efficiency of the ring resonator.

In accordance with one or more examples presented herein, an optical device such as an optical light source is provided that includes on-chip monitoring of photon density inside a cavity of the optical device without extracting a portion of the light into a separate detector thereby reducing losses and negative impacts from light reflections. The footprint of the example optical device is small and is compatible with the heterogeneous III-V on Silicon.

The example optical device includes a light-emitting structure to emit light upon application of electricity to the optical device. Further, the optical device includes a waveguide integrated capacitor that is formed integral to the structure of the optical device. In particular, the waveguide integrated capacitor may be a metal-oxide-semiconductor (MOS) capacitor formed under the light-emitting structure to monitor the light emitted by the light-emitting structure without extracting light out of the optical device (e.g., to a separate photodetector downstream of the light-emitting structure). In some examples, the waveguide integrated capacitor includes a waveguide region carrying at least a portion of the light emitted by the light-emitting structure. The waveguide region includes one or more photon absorption sites causing the generation of free charge carriers relative to an intensity of the light confined in the waveguide region resulting in a change in the conductance of the waveguide region.

In some examples, a monitoring circuit may be electrically coupled to the optical device to monitor light confined inside the optical device. In particular, the monitoring circuit may be electrically coupled to the waveguide integrated capacitor(s) at one or more monitoring sites within the optical device to cause the generation of electrical signals representative of intensities of light contained in the optical devices at the respective monitoring sites. Using the electrical signals generated via the waveguide integrated capacitor(s), the monitoring circuit may be configured to determine an optical parameter, such as but not limited to, an efficiency of the optical device. The use of the waveguide integrated capacitor may obviate the need for separate photodiodes to monitor the light, resulting in a compact footprint and reduced complexity of an optical system employing the proposed optical device.

Figure 1:
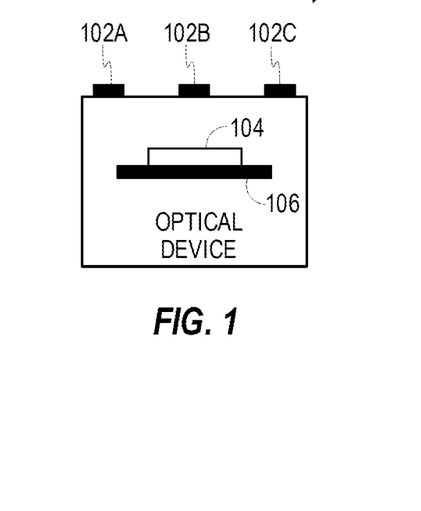
FIG. 1 depicts an example optical device having a light-emitting structure and a waveguide integrated capacitor for monitoring light.

Referring now to the drawings, in FIG. 1, an example optical device 100 is presented. The optical device 100 may be a light source such as a laser that may be disposed in an optical system (not shown) for generating light and providing light to other optical devices in the optical system. The optical device 100 of FIG. 1 may include electrical contacts 102A, 102B, 102C, a light-emitting structure 104, and a waveguide integrated capacitor 106. In the example depicted in FIG. 1, three electrical contacts 102A-102C are shown for illustration purposes. In some other examples, the optical device 100 may include a fewer or greater number of electrical contacts. The optical device 100 may receive electrical power and/or reference monitoring voltages through one or more of the electrical contacts 102A-102C.

Upon application of electrical power to the optical device 100 through one or more of the electrical contacts 102A-102C, the light-emitting structure 104 may emit light. The light-emitting structure 104 may be a region of semiconductor material(s) that generates light based on the excitation of charge carriers (e.g., electrons) due to an electric field caused across the light-emitting structure by the applied electrical power. For example, the light-emitting structure 104 may be a diode such as a light-emitting diode. In some other examples, the light-emitting structure 104 may include a heterogeneous quantum well structure or a quantum dot structure to generate the light. Additional details of the light-emitting structure 104 are described in conjunction with FIGS. 5-6.

The waveguide integrated capacitor 106 may be a MOS capacitor formed within the device structure of the optical device 100 as opposed to photodiodes used with traditional optical devices that are built outside of the traditional optical devices and receiving light through a drop port. The waveguide integrated capacitor 106 may aid in the detection of light contained within the optical device 100 without diverting any portion of the light outside of the optical device 100. In one example, the waveguide integrated capacitor 106 may include photon absorption sites (see FIG. 2) that may cause the generation of free charge carriers relative to the intensity of the optical signal inside the optical device 100. As will be understood, the generation of free charge carriers may result in a change (e.g., increase) in the conductance of a given region (e.g., a waveguide region) of the optical device. The changes in the conductance of the given region may cause variations in the current passing through the given region which may be monitored by the monitoring circuit (not shown in FIG. 1, see FIG. 4). Additional details regarding an example waveguide integrated capacitor, such as the waveguide integrated capacitor 106, are described with respect to FIG. 2.

Figure 2:
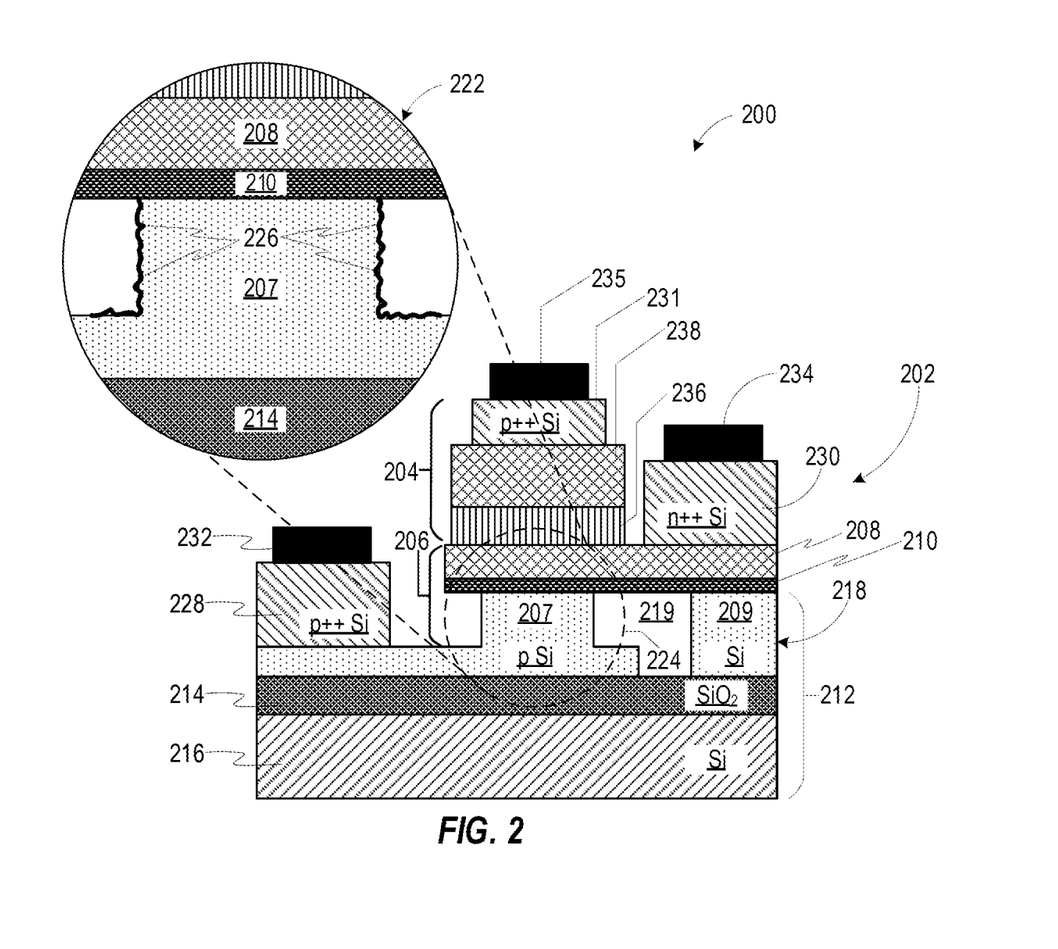
FIG. 2 depicts a cross-sectional view of an example optical device.

Referring now to FIG. 2, a cross-sectional view 200 of an example optical device 202 is presented. The optical device 202 may be an example representative of the optical device 100 and include a light-emitting structure 204 and a waveguide integrated capacitor 206. In some examples, the optical device 202 may include a waveguide region 207, a first buffer semiconductor region 208, and an insulating layer 210. The waveguide region 207, the first buffer semiconductor region 208, and the insulating layer 210 together define a metal-oxide-semiconductor (MOS) capacitor, also referred herein as, the waveguide integrated capacitor 206. In particular, the waveguide region 207 for a part of the waveguide integrated capacitor 206. The insulating layer 210 may be formed between the waveguide region 207 and the first buffer semiconductor region 208 such that the insulating layer 210 may act as an electric insulator between two electrically conductive regions, for example, the waveguide region 207 and the first buffer semiconductor region 208.

The optical device 202 may be formed using a substrate 212. In some examples, the substrate 212 may be a silicon on insulator (SOI) substrate that may include a base substrate layer 216, a base oxide layer 214, and device layer 218. The base substrate layer 216 may be made of semiconductor material, for example, silicon (Si). Other examples of materials that may be used to form the base substrate layer 216 may include III-V semiconductors, such as indium phosphide (InP), germanium (Ge), gallium arsenide (GaAs), aluminum gallium arsenide (AlGaAs), indium gallium arsenide (InGaAs), indium arsenide (InAs), or combinations thereof. Further, as depicted in FIG. 2, the substrate 212 may include a base oxide layer 214 disposed on an underlying base substrate layer 216. For example, the base oxide layer 214 may be formed by oxidizing the substrate 212. In the implementation of FIG. 2, for the base substrate layer 216 made of silicon, the base oxide layer 214 may comprise silicon dioxide ($SiO_2$), which may be formed in the presence of oxygen at a temperature in the range from 900° C. to 1380° C. In some examples, the base oxide layer 214 may be a buried oxide (BOX) layer (e.g., the $SiO_2$ may be buried in the base substrate layer 216). In some examples, a layer of the $SiO_2$ may be buried in the base substrate layer 216 at a depth ranging from less than 100 nm to several micrometers from the wafer surface depending on the application. Other examples of the base oxide layer 214 may include, but are not limited to, Silicon Nitride ($Si_3N_4$), Aluminum oxide ($Al_2O_3$), Hafnium Dioxide ($HfO_2$), diamond, silicon carbide (SiC), or combinations thereof.

Further, the substrate 212 may include a device layer 218 disposed on top of the base oxide layer 214. In the example implementation of FIG. 2, the device layer 218 is composed of silicon. The device layer 218 may be suitably shaped (e.g., via techniques such as photolithography and etching) to form one or more regions, such as, the waveguide region 207 and a non-waveguide region 209 isolated via an air-trench 219. The waveguide region 207 carries an optical signal during the operation of the optical device 202. In some examples, the waveguide region 207 may include a first-type doping (e.g., p-type doping) or compensation doped to generate net doping of the first-type. In one example, the waveguide region 207 may represent a cross-section of an annular or ring-shaped optical waveguide (see FIG. 4, for example). In another example, the waveguide region 207 may represent a cross-section of a linear optical waveguide (see FIG. 3, for example). The waveguide region 207 may be undoped, resulting in improved sensitivity to a reference variable voltage applied by the monitoring circuit, for example, the monitoring circuit 108 depicted in FIG. 1.

As depicted in an enlarged view 222 of a portion 224 of the waveguide region 207, the waveguide region 207 may have one or more photon absorption sites 226. The term "photon absorption sites" as used herein may refer to crystal imperfections or defects in the bulk of the material of the waveguide region 207, surface imperfections at the boundaries of the waveguide region 207, or both. In some examples, the photon absorption sites may have resulted from imperfections in the manufacturing process. In some examples, some photon absorption sites may be intentionally created. The photon absorption sites 226 may absorb photons and cause the generation of free charge carriers relative to the intensity of the optical signal impinging thereon inside the waveguide region 207. The conductance of the waveguide region 207 depends on the amount of the free charge carriers, such that an increase in the optical signal causes an increase in the conductance of the waveguide region 207.

The insulating layer 210 is disposed over the waveguide region 207 and/or the non-waveguide region 209. In particular, the insulating layer 210 is formed such that the insulating layer 210 is sandwiched between the waveguide region 207 and the first buffer semiconductor region 208. The insulating layer 210 may be formed of one or more dielectric materials, including but not limited to, native oxides of the materials of the waveguide region 207 or the first buffer semiconductor region 208, or both, or external dielectric materials such as high-k dielectrics or polymers which can be formed by deposition, oxidation, wafer bonding or other dielectric coating methods. Other non-limiting examples of the dielectric materials that can be used to form the insulating layer 210 may include, $SiO_2$, $Si_3N_4$, $Al_2O_3$, $HfO_2$, polyimide, benzocyclobutene (BCB), or combinations thereof.

Further, the first buffer semiconductor region 208 may be made of semiconductor material, such as a III-V semiconductor material. Examples of the III-V semiconductor materials that may be used to form the first buffer semiconductor region 208 may include, but are not limited to, GaAs, Gallium nitride (GaN), or Indium nitride (InN). The first buffer semiconductor region 208 may be formed over the insulating layer 210 using techniques such as, but not limited to, deposition, wafer bonding, monolithic growth, or other fabrication techniques. In some examples, the first buffer semiconductor region 208 may include a second-type doping (e.g., n-type doping) different from the first-type doping.

The light-emitting structure 204 may be representative of an example of the light-emitting structure 104 and is capable of generating light based on the excitation of charge carriers (e.g., electrons) due to an electric field caused across the light-emitting structure 204 by the electrical power applied via metal contacts (described later). For example, the light-emitting structure 204 may be a diode such as a light-emitting diode. In some other examples, the light-emitting structure 204 may include a heterogeneous quantum well structure (see FIG. 5) or a quantum dot structure (see FIG. 6) to generate the light.

The light-emitting structure 204 may be formed over at least a portion of the first buffer semiconductor region 208. In particular, the light-emitting structure 204 may be formed on a surface of the first buffer semiconductor region 208 above the waveguide region 207. The light-emitting structure 204 may include an optical gain region 236 and a second buffer semiconductor region 238. The optical gain region 236 may be formed over the waveguide integrated capacitor 206, more particularly, on the surface of the first buffer semiconductor region 208 above the waveguide region 207. The second buffer semiconductor region 238 may be formed over the optical gain region 236. The second buffer semiconductor region 238 may be made of semiconductor material, such as III-V semiconductor materials, for example, GaAs, GaN, or InN. In some examples, the second buffer semiconductor region 238 may have a different type of doping as compared to the first buffer semiconductor region 208. In particular, if the first buffer semiconductor region includes the second-type (e.g., n-type) doping, the second buffer semiconductor region 238 may include the first-type (e.g., p-type) doping. Forming the buffer semiconductor regions 208 and 238 to have such different types of doping may lower the optical propagation loss inside the optical device 202.

Furthermore, in some examples, the optical device 202 may include a first contact region 228, a second contact region 230, and a third contact region 231. For illustration purposes, in FIG. 2, the contact regions 228, 230, and 231 are shown as made of silicon. In some other examples, the contact regions 228 and 230 may be made of other semiconductor materials including, but not limited to, InP, Ge, GaAs, AlGaAs, InGaAs, or combinations thereof. The first contact region 228 may include the first-type doping and is disposed in contact with the waveguide region 207. Further, the second contact region 230 may include the second-type doping and is disposed in contact with the first buffer semiconductor region 208. The third contact region 231 may include the first-type doping and is disposed in contact with the second buffer semiconductor region 238. In particular, in some examples, the third contact region 231 may be formed over the second buffer semiconductor region 238.

Moreover, in some examples, the optical device 202 may include metal contacts, such as, a first metal contact 232, a second metal contact 234, and a third metal contact 235 (hereinafter collectively referred to as metal contacts 232-235). As depicted in FIG. 2, the first metal contact 232 and the second metal contact 234 are respectively disposed in electrical contact (e.g., in direct physical contact or via any intermediate electrically conductive material) with the first contact region 228 and the second contact region 230. The third metal contact 235 is disposed in electrical contact with the third contact region 231. In some examples, the metal contacts 232, 234, and 235 may be formed on top of (i.e., vertically over) the first contact region 228, the second contact region 230, and the third metal contact 235, respectively. Examples of materials used to form the metal contacts 232 and 234 may include, but are not limited to, copper (Cu), gold (Au), Al, and/or platinum (Pt). In an example, in an optical system (see FIG. 7, for example), a monitoring circuit may be electrically connected to the contact regions 228 and 230 via respective metal contacts 232 and 234. Further, for the optical device 202 to generate light, operating electric power may be applied to the optical device 202 across the metal contacts 234 and 235.

For example, during operation, electrical power (e.g., operating voltage) may be applied to the optical device 202 across the metal contacts 234 and 235. The application of the operating voltage may cause the generation of light through the optical gain region 236. At least a portion of the generated light may be confined in the waveguide region 207, the first buffer semiconductor region 208, and the optical gain region 236. Such confinement of light in the waveguide region 207 (also referred to as a modal overlap) allows for efficient coupling into passive regions where the first buffer semiconductor region 208 is etched off to create laser mirrors (not shown) or into other devices in a photonic integrated circuit that are composed entirely of silicon, such as waveguides, modulators, detectors, multiplexers, de-multiplexers, etc.

The waveguide integrated capacitor 206 aids in monitoring the light confined into the waveguide region 207 without using any external photodiodes or other devices such as splitters. To monitor the light emitted by the light-emitting structure 204, a reference voltage is applied to the second contact region 230, and a current flowing through the first contact region is measured. As previously noted, the photon absorption sites 226 may absorb photons and cause the generation of free charge carriers relative to the intensity of the optical signal impinging thereon inside the waveguide region 207. The conductance of the waveguide region 207 depends on the amount of the free charge carriers, such that an increase in the optical signal causes an increase in the conductance of the waveguide region 207. Consequently, the current flowing through the waveguide integrated capacitor 206 may vary. The variation in the current is proportional to the change in the conductance of the waveguide region indicative of the light emitted by the light-emitting structure. As will be appreciated, the use of a waveguide integrated capacitor such as the waveguide integrated capacitor 206 may aid in the detection of light within the optical device without the need of diverting any portion of the light out of the waveguide region 207. Further, in some examples, the use of the waveguide integrated capacitor may obviate the need for separate photodiodes to monitor the light, resulting in a compact footprint and reduced complexity of the proposed optical system. Moreover, in some examples, by using the waveguide integrated capacitors in the optical components and a common monitoring circuit, tasks such as operation monitoring and debugging can be easily performed in the proposed optical system.

Figure 3:
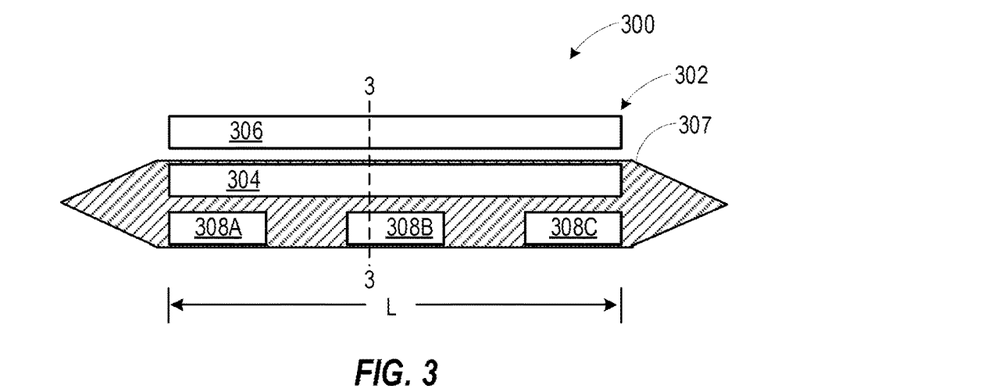
FIG. 3 depicts a top view of an example optical device.

Turning to FIG. 3, a top view 300 of an example optical device 302 is depicted. The optical device 302 is a linear light source (e.g., laser). The optical device 302 may be an example representative of the optical device 202 and may include one or more material regions that are similar to those described in FIG. 2 for the optical device 202 although not all such regions are depicted in FIG. 3 for simplicity of illustration. In some examples, instead of having a continuous contact region such as the contact region 228 along the circumference of the waveguide region 207 of FIG. 2, the contact region may be split into a plurality of sections to allow monitoring of light intensities at respective locations inside the optical device 302. For example, the optical device 302 may include contact regions such as the contact regions 304, 306, and contact region sections 308A, 308B, and 308C. For illustration purposes, in the top-view 300 of FIG. 3, the contact regions 304, 306, a waveguide region 307, and the contact region sections 308A, 308B, and 308C are depicted. Although the optical device 302 is shown to include three contact region sections 308A-308C, the use of a fewer or greater number of contact region sections is envisioned within the purview of the present disclosure. The optical device 302 may have the same cross-section as depicted in FIG. 2 at several locations along the length "L" of the optical device 302, more particularly, when taken at the locations of the contact region sections 308A, 308B, and 308C. For example, a cross-section of the optical device 302 taken at the example location 3-3 along the contact region section 308B may look similar to the cross-sectional view 200 depicted in FIG. 2. Also, the optical device 302 may include metal contacts (not shown) disposed in contact with each of the contact regions 304, 306, and the contact region sections 308A-308C.

The contact regions 304 and 306 are examples representative of the contact regions 230 and 231 of FIG. 2 and are disposed similarly as the contact regions 228 and 231. In particular, the contact region 304 is disposed in contact with the first buffer semiconductor region (not shown) of a waveguide integrated capacitor of the optical device 302 along the length of the optical device 302. The contact region 306 is disposed over a second buffer semiconductor region (similar to the second buffer semiconductor region 238, not shown) of a light-emitting structure of the optical device 302. Further, the contact region sections 308A-308C are representative of the contact region 228 of FIG. 2. In particular, the contact region sections 308A-308C are physically and/or electrically isolated from each other and are disposed over the waveguide region 307.

In one example, to measure the light inside the optical device 302, a reference sinusoidal voltage may be applied to the contact region 304, and electrical current flowing through one or more of the contact region sections 308A-308C may be monitored via a monitoring circuit (not shown). As previously noted, in a similar fashion as described with reference to the waveguide region 207, changes in the light intensities inside the waveguide region 307 may also cause changes in the conductance of the waveguide region 307. Consequently, the current flowing through the waveguide integrated capacitor of the optical device 302 may vary. The variation in the current is proportional to the change in the conductance of the waveguide region 307 indicative of the light emitted by the light-emitting structure. Measurement of electrical current through the contact region sections 308A-308C may be indicative of light intensities contained inside the waveguide region at the location of the respective contact region sections.

Figure 4:
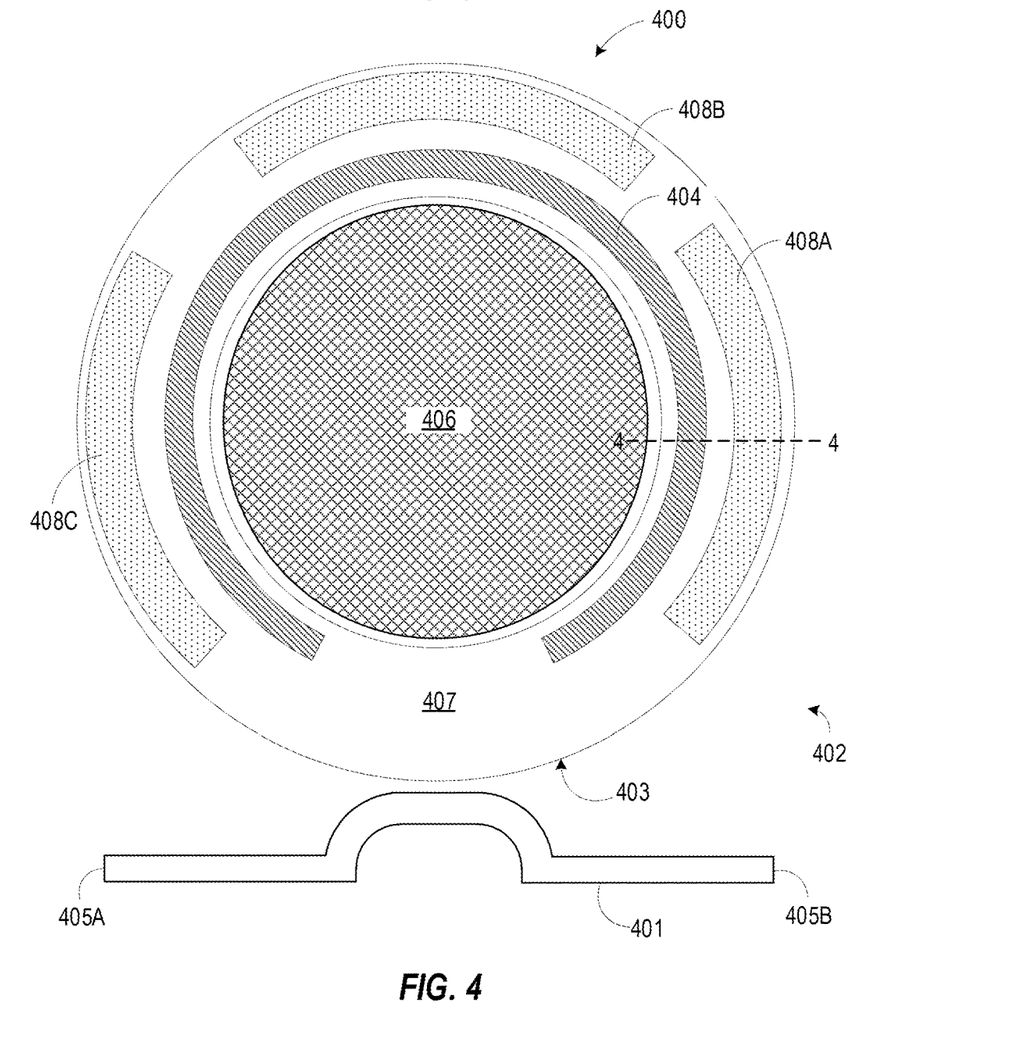
FIG. 4 depicts a top view of another example optical device.

Referring now to FIG. 4, a top view 400 of an example optical device 402 is presented. The optical device 402 may be an annular light source (e.g., a ring laser). The optical device 402 may be an example representative of the optical device 202 and may include one or more material regions that are similar to those described in FIG. 2 for the optical device 202 although not all such regions are depicted in FIG. 4 for simplicity of illustration. In the example implementation shown in FIG. 4, the optical device 402 is shown to include a coupling waveguide 401 and a ring laser waveguide 403. The coupling waveguide 401 may be disposed adjacent to and is evanescently coupled to the ring laser waveguide 403. The coupling waveguide 401 may include output ports 405A and 405B. The light generated in the ring laser waveguide 403 may be coupled into the coupling waveguide 401 and can be supplied to other optical devices (not shown) via one or both of the output ports 405A and 405B. In some examples, the ring laser waveguide 403 may include a waveguide integrated capacitor such as the waveguide integrated capacitor 206 shown in FIG. 2 to detect the light intensity inside the ring laser waveguide 403. In some examples, both the coupling waveguide 401 and the ring laser waveguide 403 may include waveguide integrated capacitors.

In a similar fashion as described in FIG. 3, in the optical device 402, one or more of the contact regions may be split into a plurality of sections to allow monitoring of light intensities at respective locations inside the optical device 402. For example, the optical device 402 may include contact regions such as the contact regions 404, 406, and contact region sections 408A, 408B, and 408C. Instead of having a single contact region such as the contact region 228 along the circumference of the waveguide region 207 of FIG. 2, the optical device 402 includes contact region sections 408A, 408B, and 408C. For illustration purposes, in the top view 400 of FIG. 4, the contact regions 404, 406, a waveguide region 407, and the contact region sections 408A, 408B, and 408C are depicted. Although the optical device 302 is shown to include three contact region sections 408A-408C, the use of a fewer or greater number of contact region sections is envisioned within the purview of the present disclosure. The optical device 402 may also have the same cross-section as depicted in FIG. 2 at several locations along the annulus of the ring laser waveguide 403, more particularly, when taken at the locations of the contact region sections 408A, 408B, and 408C. For example, a cross-section of the optical device 402 taken at the example location 4-4 along the contact region section 408B may look similar to the cross-sectional view 200 depicted in FIG. 2. Also, the optical device 402 may include metal contacts (not shown) disposed in contact with each of the contact regions 404, 406, and the contact region sections 408A-408C.

The contact regions 404 and 406 are example representatives of the contact regions 230 and 231 of FIG. 2 and are disposed in a similar fashion as the contact regions 230 and 231. In particular, the contact region 404 is disposed in contact with the first buffer semiconductor region (not shown) of a waveguide integrated capacitor of the optical device 402 along the annulus of the optical device 402. Further, the contact region 406 is disposed over a second buffer semiconductor region (similar to the buffer semiconductor region 238, not shown) of a light-emitting structure of the optical device 402. Further, the contact region sections 408A-408C are representatives of the contact region 228 of FIG. 2. In particular, the contact region sections 408A-408C are physically isolated from each other and are disposed over the waveguide region 407 along the circumference of the waveguide region 407.

In one example, to measure the light inside the optical device 402, a reference sinusoidal voltage may be applied to the contact region 404, and electrical current through one or more of the contact region sections 408A-408C may be monitored via a monitoring circuit (not shown). As previously noted, in a similar fashion as described with reference to the waveguide region 207, changes in the light intensities inside the waveguide region 407 may also cause changes in the conductance of the waveguide region 407. Consequently, the current flowing through the waveguide integrated capacitor of the optical device 402 may vary. The variation in the current is proportional to the change in the conductance of the waveguide region indicative of the light emitted by the light-emitting structure. Measurement of electrical current through the contact region sections 408A-408C may indicate light intensities contained inside the waveguide region at the location of the respective contact region sections.

Figure 5:
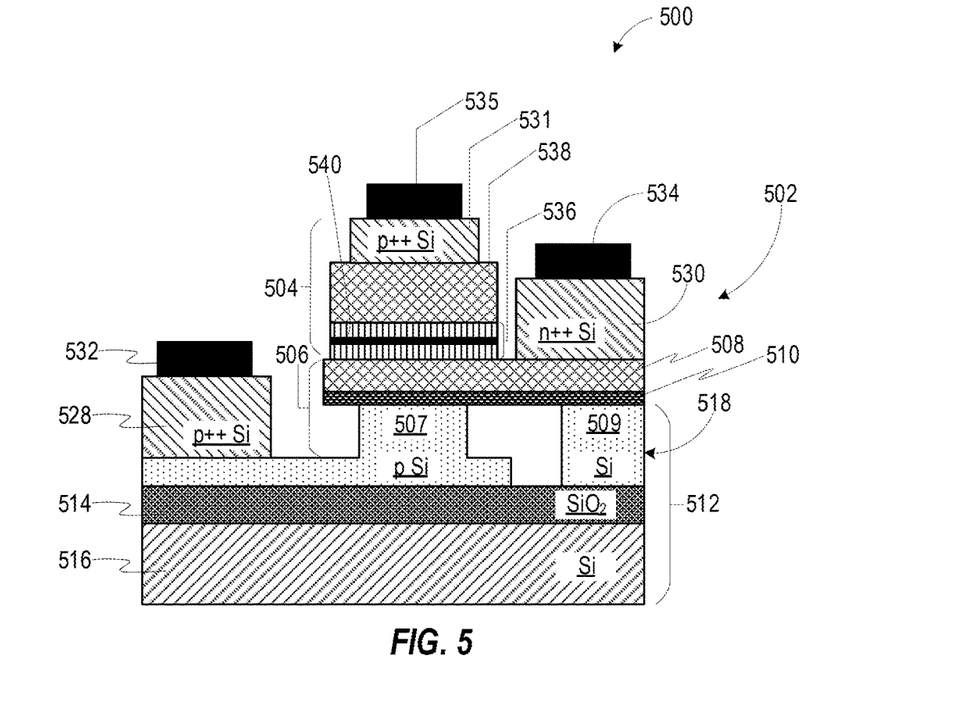
FIG. 5 depicts a cross-sectional view of an example optical device.

FIG. 5 depicts a cross-sectional view 500 of an optical device 502, in accordance with an example. The optical device 502 of FIG. 5 may be representative of one example of the optical device 202 of FIG. 2 and may include one or more structural elements similar, in one or more aspects, to those described in FIG. 2—description of which is not repeated herein for the sake of brevity. For example, in FIG. 5, the optical device 502 is shown to include a light-emitting structure 504, a waveguide integrated capacitor 506, a waveguide region 507, a first buffer semiconductor region 508, an insulating layer 510, a substrate 512 having a base substrate layer 516, a base oxide layer 514, and a device layer 518, non-waveguide region 509, contact regions 528, 530, and metal contacts 532, 534.

Further, the light-emitting structure 504 may include optical gain region 536, a second buffer semiconductor region 538, a contact region 531, and a metal contact 535. The waveguide region 507 and the non-waveguide region 509 are formed in the device layer 518 of the substrate 512. The waveguide region 507 includes photon absorption sites (not shown) similar to the photon absorption sites 226 shown in FIG. 2. The insulating layer 510 is disposed over the waveguide region 507 and/or the non-waveguide region 509. Further, the first buffer semiconductor region 508 is formed over the insulating layer 510. The light-emitting structure 504 may be formed over at least a portion of the first buffer semiconductor region 508. In particular, the light-emitting structure 504 may be formed on a surface of the first buffer semiconductor region 508 above the waveguide region 507.

In the example of FIG. 5, the optical gain region 536 in the light-emitting structure 504 includes a quantum well structure. In FIG. 5, the optical gain region 536 is shown to include a quantum well region 540. In particular, the quantum well region 540 is made of several III-V layers of different composition and doping to provide lateral carrier (electrons and holes) confinement and are also referred to as separate confinement heterostructures (SCH) and quantum wells (QW) or as an active region. In the quantum well region 540, carriers are confined in one dimension but can move in the other two dimensions. The carrier distribution in the quantum well region 540 caused by a current flow through optical gain region 536, facilitates light generation or optical gain at a wavelength close to the bandgap of the material making up the quantum well region 540.

Figure 6:
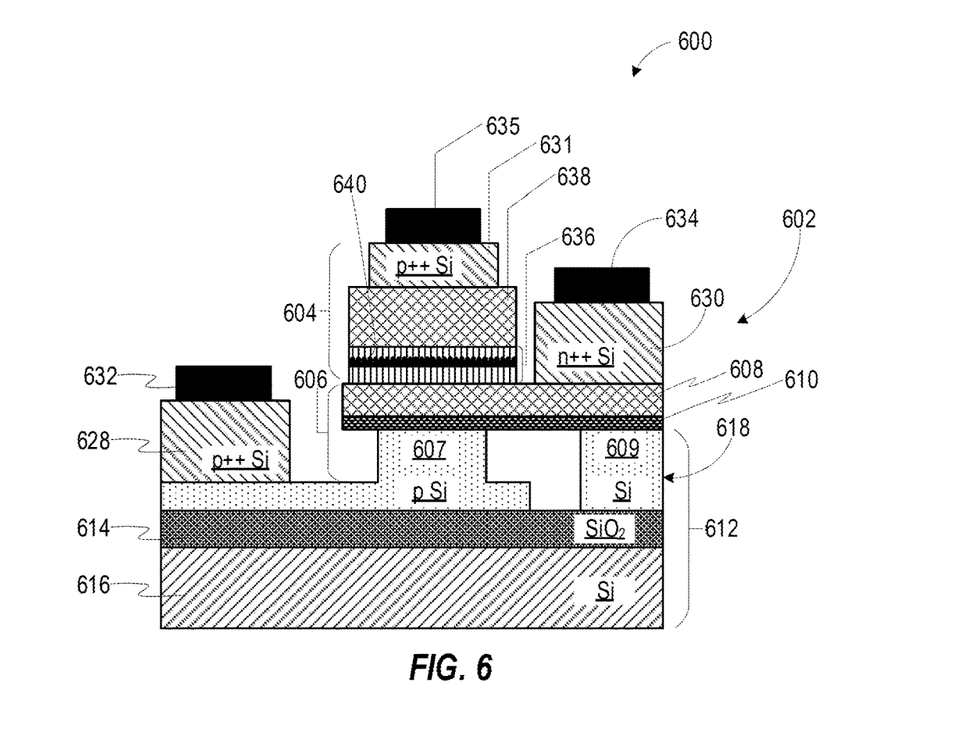
FIG. 6 depicts a cross-sectional view of another example optical device.

FIG. 6 depicts a cross-sectional view 600 of an example optical device 602. The optical device 602 of FIG. 6 may be representative of one example of the optical device 202 of FIG. 2 and may include one or more structural elements similar, in one or more aspects, to those described in FIG. 2—description of which is not repeated herein for the sake of brevity. For example, in FIG. 6, the optical device 602 is shown to include a light-emitting structure 604, a waveguide integrated capacitor 606, a waveguide region 607, a first buffer semiconductor region 608, an insulating layer 610, a substrate 612 having a base substrate layer 616, a base oxide layer 614, and a device layer 618, non-waveguide region 609, contact regions 628, 630, and metal contacts 632, 634. The light-emitting structure 604 may include optical gain region 636, a second buffer semiconductor region 638, a contact region 631, and a metal contact 635. The waveguide region 607 and the non-waveguide region 609 are formed in the device layer 618 of the substrate 612. The waveguide region 607 may include photon absorption sites (not shown) similar to the photon absorption sites shown in FIG. 2. The insulating layer 610 is disposed over the waveguide region 607 and/or the non-waveguide region 609. Further, the first buffer semiconductor region 608 is formed over the insulating layer 610. The light-emitting structure 604 may be formed over at least a portion of the first buffer semiconductor region 608. In particular, the light-emitting structure 604 may be formed on a surface of the first buffer semiconductor region 608 above the waveguide region 607.

In the example of FIG. 6, the optical gain region 636 in the light-emitting structure 604 includes a quantum dot structure. In FIG. 3, the optical gain region 636 is shown to include a quantum dot region 640. The quantum dot region 640 is made of several III-V layers of different compositions and doping to provide lateral carrier (electrons and holes) confinement and are also referred to as SCH, quantum dots, or an active region. In particular, the quantum dot region 640 is confined in three dimensions and has a discrete energy spectrum, like an atom. The carrier distribution in the quantum dot region 640 caused by a current flow through optical gain region 636, facilitates light generation or optical gain at a wavelength close to the bandgap of the material making up the quantum dot region 640.

Figure 7:
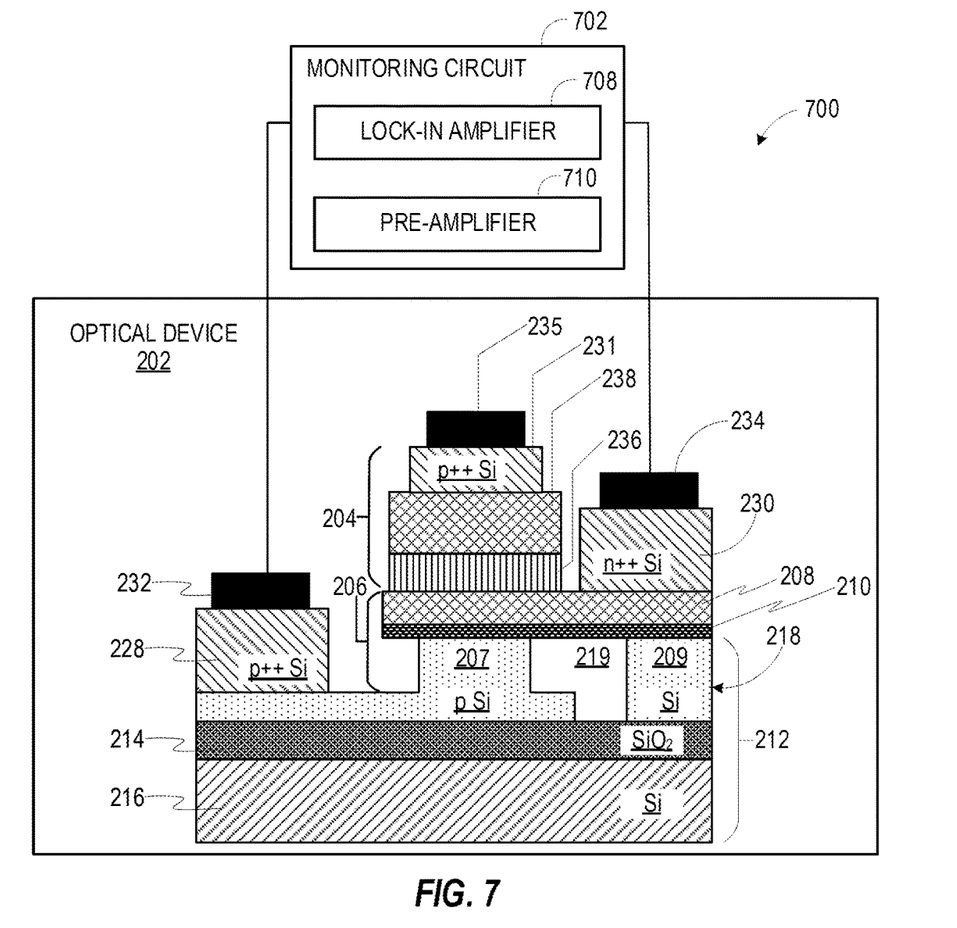
FIG. 7 depicts a block diagram of an example optical system having an example optical device.

FIG. 7 presents an example optical system 700. The optical system 700 may include an optical device such as the optical device 202 capable of generating light and a monitoring circuit 702 to monitor the light inside the optical device 100. In some examples, the optical system 700 may include more than one optical device, without limiting the scope of the present disclosure.

As previously noted, the optical device 202 includes the light-emitting structure 204 that generates light, and the waveguide integrated capacitor 206 that aids in detecting the light intensity inside the optical device 202 without extracting the light outside of the waveguide region 207. Upon application of a voltage across the waveguide integrated capacitor 206, the photon absorption sites 226 may cause the generation of free charge carriers relative to the intensity of the optical signal inside the optical device. As will be understood, the generation of free charge carriers may result in a change (e.g., increase) in the conductance of a given region (e.g., a waveguide region 207) within the respective optical components. The changes in the conductance of the given region may cause variations in the current passing through the given region which may be monitored by the monitoring circuit 702.

The monitoring circuit 702 may be electrically coupled to the waveguide integrated capacitor 206 at one or more monitoring sites. In some examples, the monitoring circuit 702 may cause the waveguide integrated capacitor 206 to generate electrical signals indicative of the light intensities at the monitoring site. To effect the generation of the electrical signals, in some examples, the monitoring circuit 702 may include a lock-in amplifier 708 and a preamplifier 710. In some examples, the lock-in amplifier 708 may generate a reference variable voltage signal, for example, a sinusoidal signal. For a given waveguide integrated capacitor, the lock-in amplifier 708 may determine a frequency of the reference variable voltage signal based on the conductance of a waveguide region in the given waveguide integrated capacitor and a capacitance of the given waveguide integrated capacitor. In one example, the lock-in amplifier 708 may determine the frequency ($F_0$) of the reference variable voltage signal based on an example relationship of equation (1).

$$F_0 = \frac{G_{WG}}{2\pi * C} \qquad \text{Equation (1)}$$

where, $G_{WG}$ represents the conductance of the waveguide region 207 in the given waveguide integrated capacitor and C represents the capacitance of the given waveguide integrated capacitor 206. In certain other examples, the frequency ($F_0$) of the reference variable voltage signal may be set to any value greater than $$\frac{G_{WG}}{2\pi * C}.$$

The monitoring circuit 702 may apply a reference variable voltage signal having the frequency $F_0$ to the waveguide integrated capacitor 206. As previously noted, the conductance of the waveguide region 207 may change depending on the intensity of the optical signal therein. Consequently, the current flowing through the waveguide region 207 may also vary. In particular, the magnitude of electrical current generated by the waveguide integrated capacitor 206 may be influenced by the light intensity inside the waveguide region 207, because the conductance of the waveguide region at the monitoring site changes due to the presence of free carriers created by the absorption of photons at the photon absorption sites 226.

The monitoring circuit 702 may measure the electrical signals (e.g., electrical currents) through the waveguide integrated capacitor 206 that is in turn representative of the intensity of the light contained inside waveguide region 207. In some examples, the electrical current received by the monitoring circuit 702 from the waveguide integrated capacitor 206 may be weak in strength. The preamplifier 710 may amplify the electrical currents for further processing by the lock-in amplifier 708.

Figure 8:
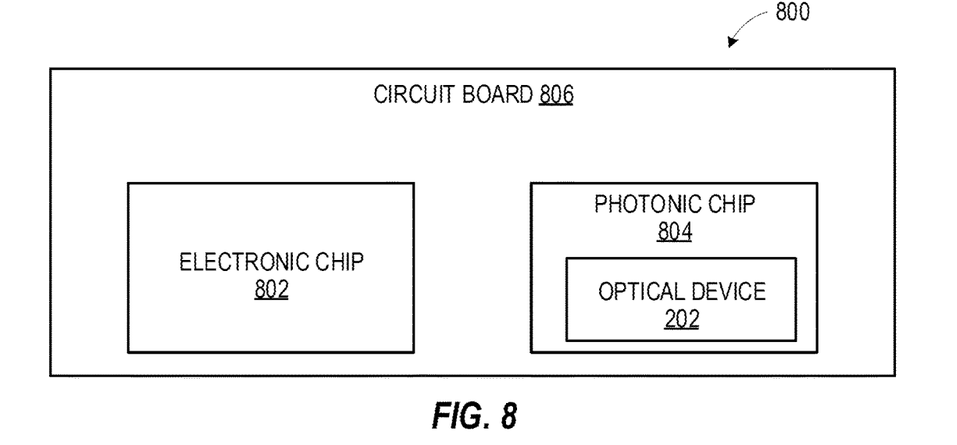
FIG. 8 depicts a block diagram of an example multi-chip module having an electronic chip and a photonic chip having an example optical device.

FIG. 8 depicts a block diagram of an example multi-chip module 800. In some examples, the multi-chip module 800 is implemented as a sub-system within an electronic system such as, but not limited to, computers (stationary or portable), servers, storage systems, wireless access points, network switches, routers, docking stations, printers, or scanners. Such electronic systems may be offered as stand-alone products, packaged solutions, and can be utilized on one-time full product/solution purchases or pay-per-use or consumption basis. In an example implementation, the multi-chip module may include at least one electronic chip such as an electronic chip 802 and at least one photonic chip such as a photonic chip 804 mounted on a circuit board 806. The circuit board 806 may be a printed circuit board (PCB) that includes several electrically conductive traces (not shown) to interconnect the electronic chip 802 and the photonic chip 804 with each other and with other components disposed on or outside of the circuit board 806. Non-limiting examples of the electronic chip 802 may include IC chips such as, but not limited to, an application-specific integrated circuit (ASIC), a field-programmable gate array (FPGA) chip, a processor chip (e.g., central processing unit and/or graphics processing unit), a memory chip, a wireless communication module chip, power supply chips or modules, electronic devices such as capacitors, inductors, resistors, or the like. In one example, the electronic chip 802 may be configured to operate as a photonics controller. During the operation of the multi-chip module 800, the electronic chip 802 may be configured to send and receive data and/or control signals to the photonic chip 804.

The photonic chip 804 may include one or more optical devices such as but not limited to, or optical detectors, optical filters, optical cables, waveguides, optical modulators, light sources (e.g., lasers), and the like. The photonic chip 804 may function as an optical receiver, optical transmitter, optical transceiver, optical communication and/or processing medium for the data and control signals received from the electronic chip. In some examples, the photonic chip 804 may include an optical device 202 as depicted in FIG. 2, for example, the description of which is not repeated herein for the sake of brevity. Use of the other optical devices such as the optical devices 102, 302, 402, 502, or 602 in the photonic chip 804 is also envisioned within the purview of the present disclosure. Further, in some examples, the electronic chip 802 may also function as a monitoring circuit, such as, the monitoring circuit 702 described in FIG. 7, to monitor light inside the optical device 202 of the photonic chip 804. In certain other examples, the multi-chip module 800 may include an additional electronic chip or circuit that functions as the monitoring circuit 702.

Figure 9:
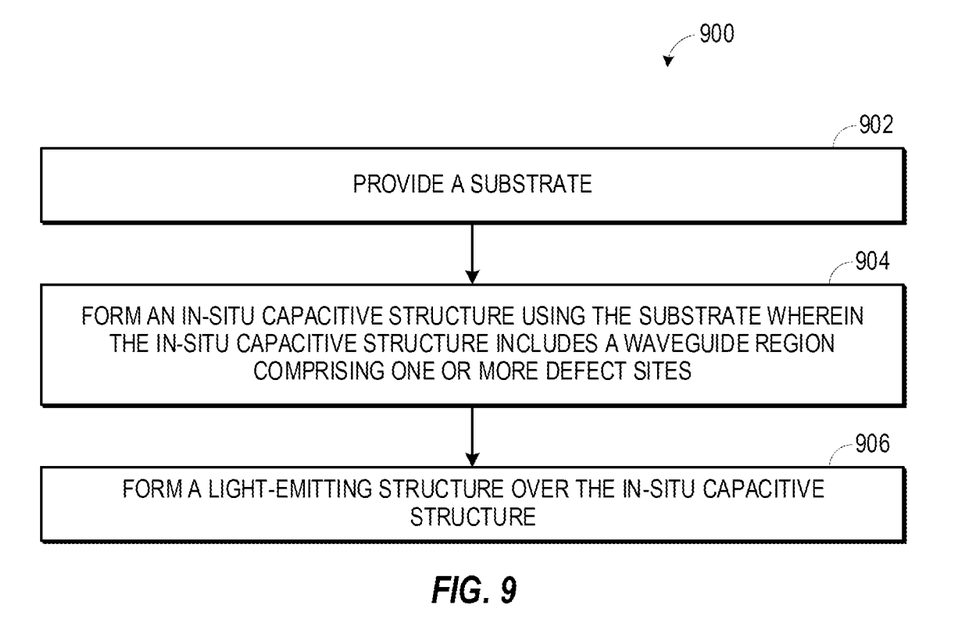
FIG. 9 depicts a flow diagram of an example method of fabricating an example optical device.

FIG. 9 depicts an example method 900 of forming an optical device such as the optical device 100 of FIG. 1. For illustration purposes the method 900 is described in conjunction with FIG. 1, however, the method steps described herein may also apply to other example optical devices described hereinabove.

At block 902, a substrate is provided. The substrate may be SOI substrate in one example. Further at block 904, a waveguide integrated capacitor such as the waveguide integrated capacitor 106 may be formed using the substrate wherein the waveguide integrated capacitor may include a waveguide region comprising one or more photon absorption sites. The photon absorption sites may be imperfections in the bulk of the material of the waveguide region, surface imperfections at the boundaries of the waveguide region, or both. In some examples, photon absorption sites may have resulted from imperfections in the manufacturing process. In some examples, photon absorption sites may be intentionally created. Further, at block 906, a light-emitting structure such as the light-emitting structure 104 may be formed over the waveguide integrated capacitor, wherein the light-emitting structure emits light upon application of electricity to the optical device. Additional details of forming the waveguide integrated capacitor and the light-emitting structure are described in conjunction with FIG. 10. The waveguide region contains at least a portion of the light generated by the light-emitting structure and the photon absorption sites cause the generation of free charge carriers relative to an intensity of the light confined in the waveguide region resulting in a change in the conductance of the waveguide region.

Figure 10:
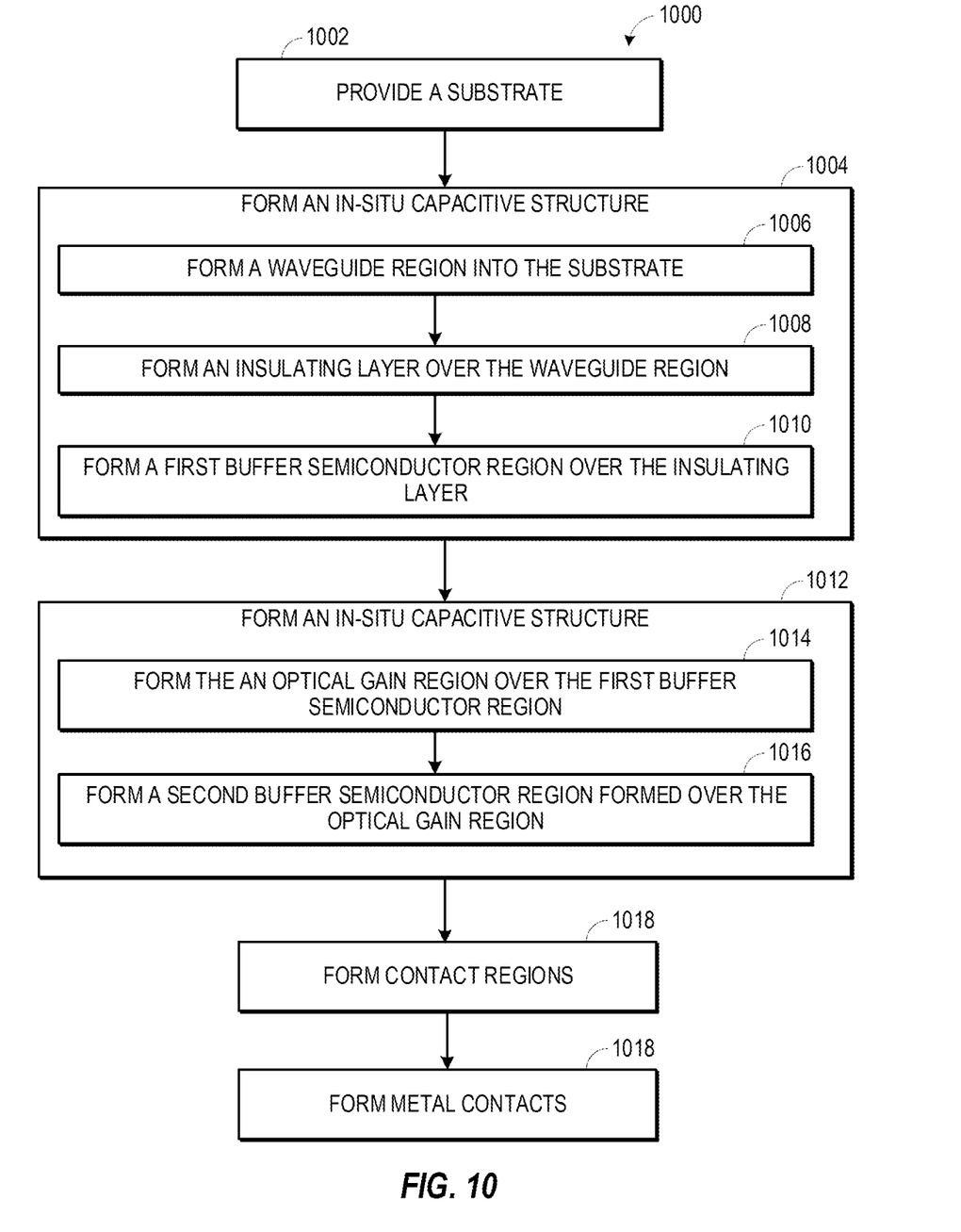
FIG. 10 depicts a flow diagram of another example method of fabricating an example optical device.

Referring now to FIG. 10, an example method 1000 of forming an optical device such as the optical device 202 of FIG. 2. For illustration purposes the method 1000 is described in conjunction with FIG. 2, however, the method steps described herein may also apply to other example optical devices described hereinabove.

At block 1002, a substrate, such as, the substrate 212 may be provided. The substrate 212 may be an SOI substrate having the base substrate layer 216, the base oxide layer 214, and the device layer 218. Further, at block 1004, a waveguide integrated capacitor such as the waveguide integrated capacitor 206 may be formed using the substrate 212. In one example, forming the waveguide integrated capacitor 206 may include forming, at block 1006, the waveguide region 207 and the non-waveguide region 209 into the substrate 212. As previously noted, in some examples, the imperfections are intentionally formed into the waveguide region 207 to have photon absorption sites such as the photon absorption sites 226. In some cases, the photon absorption sites 226 are caused by imperfections in the manufacturing processes. Further, in some examples, the waveguide region 207 may be lightly doped to achieve a first-type doping. In particular, the waveguide region 207 and the non-waveguide region 209 may be formed by photolithographically defining and masking the areas for waveguide region 207 and the non-waveguide region 209 and then chemically and/or mechanically etching the unmasked areas. Further, forming the waveguide integrated capacitor 206 may include forming, at block 1008, the insulating layer 210 over the waveguide region 207 and the non-waveguide region 209. The insulating layer 210 may be formed using thermal growth techniques and/or using deposition techniques, such as, chemical vapor deposition (CVD), for example. Furthermore, forming the waveguide integrated capacitor 206 may include forming, at block 1010, a first buffer semiconductor region 208 over the insulating layer 210 using thermal growth techniques and/or using deposition techniques, such as, CVD, for example, or wafer bonding.

Moreover, in some examples, the method 1000 may include forming, at block 1012, the light-emitting structure such as the light-emitting structure 204 over the waveguide integrated capacitor 206. The light-emitting structure 204 may be formed by forming an optical gain region such as the optical gain region 236 and a second buffer semiconductor region such as the buffer semiconductor region 238. For example, at block 1014, the optical gain region 236 may be formed over the first buffer semiconductor region 208. As described earlier, the optical gain region 236 may include a quantum well structure (see FIG. 5) or a quantum dot structure (see FIG. 6). In particular, in some examples, the optical gain region 236 may be formed on the top surface of the first buffer semiconductor region 208 above the waveguide region 207 using techniques such as, but not limited to, thermal growth or CVD, wafer bonding, molecular beam epitaxy (MBE) for example. Further, at block 1016, the second buffer semiconductor region 238 may be formed over the optical gain region 236 using similar techniques used to form the first buffer semiconductor region 208.

Moreover, in some examples, at block 1018, one or more contact regions such as the contact regions 228, 230, and 231 may be formed. The contact regions 228, 230, and 231 may be formed using techniques such as, but not limited to, thermal growth and/or CVD, wafer bonding, MBE and performing doping with respective impurities. For example, the contact regions 228 and 231 are doped to include first-type doping, and the contact region 230 is doped to include the second-type doping. Further, in some examples, at block 1020, metal contacts such as the metal contact 232, 234, and 235 are formed over the contact regions 228, 230, and 231, respectively.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled to" as used herein, is defined as connected, whether directly without any intervening elements or indirectly with at least one intervening element, unless indicated otherwise. For example, two elements may be coupled to each other mechanically, electrically, optically, or communicatively linked through a communication channel, pathway, network, or system. Further, the term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

While certain implementations have been shown and described above, various changes in form and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. An optical device, comprising:
   a light-emitting structure to emit light upon application of electricity to the optical device; and
   a waveguide integrated capacitor formed under the light-emitting structure to monitor the light emitted by the light-emitting structure, wherein the waveguide integrated capacitor comprises a waveguide region carrying at least a portion of the light, and wherein the waveguide region comprises one or more photon absorption sites for absorbing photons of the portion of the light carried in the waveguide region and causing generation of free charge carriers relative to an intensity of the light confined in the waveguide region based on the absorbed photons resulting in a change in a conductance of the waveguide region that is proportional to the intensity of the portion of the light carried in the waveguide region.

2. The optical device of claim 1, wherein the waveguide integrated capacitor further comprises a first contact region comprising a first-type doping and disposed in contact with the waveguide region.

3. The optical device of claim 2, wherein the waveguide integrated capacitor further comprises a first buffer semiconductor region, and an insulating layer disposed between the waveguide region and the first buffer semiconductor region.

4. The optical device of claim 3, wherein the waveguide region comprises a first type doping and the first buffer semiconductor region comprises a second-type doping.

5. The optical device of claim 3, wherein the waveguide integrated capacitor further comprises a second contact region comprising a second-type doping and disposed in contact with the first buffer semiconductor region.

6. The optical device of claim 5, wherein to monitor the light emitted by the light-emitting structure without extracting the light outside of the optical device, a reference voltage is applied to the second contact region and a current flowing through the first contact region is measured, wherein a variation in the current is proportional to the change in the conductance of the waveguide region indicative of the light emitted by the light-emitting structure.

7. The optical device of claim 1, wherein the waveguide integrated capacitor further comprises a plurality of physically isolated contact region sections disposed in contact with the waveguide region.

8. The optical device of claim 1, wherein the light-emitting structure comprises:
   an optical gain region formed over the waveguide integrated capacitor; and
   a second buffer semiconductor region formed over the optical gain region.

9. The optical device of claim 8, wherein the optical gain region comprises a quantum well structure.

10. The optical device of claim 8, wherein the optical gain region comprises a quantum dot structure.

11. The optical device of claim 1, further comprising:
    a monitoring circuit configured to monitor the intensity of the light emitted by the light-emitting structure without extracting the light outside of the optical device, the monitoring circuit configured to apply a reference voltage to the waveguide integrated capacitor and the waveguide region and measure a current flowing through the waveguide region, wherein a variation in the current is proportional to the change in the conductance of the waveguide region indicative of the intensity of the light confined in the waveguide region.

12. The optical device of claim 1, wherein the one or more photon absorption sites comprises at least one of imperfections in a material of the waveguide region, defects in the material of the waveguide region, and surface imperfections at boundaries of the waveguide region.

13. A multi-chip module, comprising:
    an electronic chip; and
    a photonic chip coupled to the electronic chip communicatively coupled with the electronic chip, the photonic chip comprising an optical device comprising:
      a light-emitting structure comprising an optical gain region to emit light upon application of electricity to the optical device; and
      a waveguide integrated capacitor formed under the light-emitting structure to monitor the light emitted by the light-emitting structure, wherein the waveguide integrated capacitor comprises:
        a waveguide region carrying at least a portion of the light,
        a first buffer semiconductor region; and
        an insulating layer disposed between the waveguide region and the first buffer semiconductor region,
        wherein the waveguide region comprises one or more photon absorption sites causing generation of free charge carriers relative to an intensity of the light confined in the waveguide region resulting in a change in a conductance of the waveguide region.

14. The multi-chip module of claim 13, wherein the waveguide integrated capacitor further comprises:
    a first contact region comprising a first-type doping and disposed over the waveguide region; and
    a second contact region comprising a second-type doping and disposed over the first buffer semiconductor region.

15. The multi-chip module of claim 13, wherein the waveguide integrated capacitor further comprises:
    a plurality of physically isolated contact region sections first contact region comprising a first-type doping and disposed over the waveguide region; and
    a second contact region comprising a second-type doping and disposed over the first buffer semiconductor region.

16. The multi-chip module of claim 13, wherein the optical gain region comprises a quantum well structure or a quantum dot structure.

17. The multi-chip module of claim 13, wherein the light-emitting structure further comprises a second buffer semiconductor region formed over the optical gain region.

18. The multi-chip module of claim 13, further comprising a monitoring circuit coupled to the photonic chip to monitor light intensity inside the optical device without diverting any portion of the light outside of the waveguide region.

19. A method of forming an optical device, comprising:
providing a substrate;
forming a waveguide integrated capacitor using the substrate wherein the waveguide integrated capacitor comprises a waveguide region comprising one or more photon absorption sites; and
forming a light-emitting structure over the waveguide integrated capacitor, wherein the light-emitting structure is to emit light upon application of electricity to the optical device,
wherein the waveguide region contains at least a portion of the light generated by the light-emitting structure and the one or more photon absorption sites absorbs photons of the portion of the light carried in the waveguide region and causes generation of free charge carriers relative to an intensity of the light confined in the waveguide region based on the absorbed photons resulting in a change in a conductance of the waveguide region that is proportional to the intensity of the portion of the light carried in the waveguide region.

20. The method of claim 19, wherein forming the waveguide integrated capacitor comprises:
forming the waveguide region into the substrate;
forming an insulating layer over the waveguide region; and
forming a first buffer semiconductor region over the insulating layer.

21. The method of claim 20, wherein forming the light-emitting structure over the waveguide integrated capacitor comprises:
forming an optical gain region over the first buffer semiconductor region; and
forming a second buffer semiconductor region formed over the optical gain region.

22. The method of claim 21, wherein the optical gain region comprises a quantum well structure or a quantum dot structure.

* * * * *